US008362527B2

(12) United States Patent
Matsushima et al.

(10) Patent No.: US 8,362,527 B2
(45) Date of Patent: Jan. 29, 2013

(54) SOLID-STATE IMAGING DEVICE AND FABRICATION METHOD THEREOF

(75) Inventors: Osamu Matsushima, Kyoto (JP); Kenichi Miyazaki, Kyoto (JP)

(73) Assignee: Rohm Co., Ltd., Kyoto-Fu (JP)

( * ) Notice: Subject to any disclaimer, the term of this patent is extended or adjusted under 35 U.S.C. 154(b) by 246 days.

(21) Appl. No.: 12/808,757

(22) PCT Filed: Dec. 8, 2008

(86) PCT No.: PCT/JP2008/072261
§ 371 (c)(1),
(2), (4) Date: Jun. 17, 2010

(87) PCT Pub. No.: WO2009/078299
PCT Pub. Date: Jun. 25, 2009

(65) Prior Publication Data
US 2010/0276738 A1   Nov. 4, 2010

(30) Foreign Application Priority Data

Dec. 19, 2007  (JP) .................................. 2007-327423

(51) Int. Cl.
*H01L 27/146* (2006.01)
*H01L 31/0232* (2006.01)
(52) U.S. Cl. . 257/225; 257/444; 257/749; 257/E31.079; 257/E21.068; 438/69; 438/95
(58) Field of Classification Search .................. 257/290, 257/291, 292, 293, 444, 613, E31.008, E31.027, 257/E31.08, 295, 233, E33.076, E31.076, 257/E31.079, E31.082, E27.133, E21.001, 257/E21.002, E21.068, E21.071; 438/84, 438/93, 95, 102, FOR. 392
See application file for complete search history.

(56) References Cited

U.S. PATENT DOCUMENTS

| | | | | |
|---|---|---|---|---|
| 2005/0072461 A1* | 4/2005 | Kuchinski et al. | ............ | 136/256 |
| 2009/0217969 A1* | 9/2009 | Matsushima et al. | ......... | 136/252 |
| 2010/0243057 A1* | 9/2010 | Nakatani et al. | .............. | 136/261 |
| 2012/0146147 A1* | 6/2012 | Hook | ............................ | 257/351 |

FOREIGN PATENT DOCUMENTS

| | | |
|---|---|---|
| JP | 04-030576 | 2/1992 |
| JP | 07-226410 | 8/1995 |
| JP | 2001-144279 | 5/2001 |
| JP | 2004-095931 | 3/2004 |

* cited by examiner

*Primary Examiner* — Olik Chaudhuri
*Assistant Examiner* — Quovaunda V Jefferson
(74) *Attorney, Agent, or Firm* — Fish & Richardson P.C.

(57) ABSTRACT

Provision of a solid-state imaging device of a planarized structure with reduced dark currents, allowing for high sensitivities over a wide wavelength band ranging from visible wavelengths to near-infrared wavelengths, and a fabrication method of the same.

There are steps of having circuitry (30) formed on a substrate (10), forming a lower electrode layer (25) on the circuitry (30), patterning the lower electrode layer (25) to separate pixel-wise into a set of segments, forming a compound-semiconductor thin film of chalcopyrite structure (24) over a whole area of element regions, applying a resist layer (27) on the compound-semiconductor thin film (24) to pixel-wise pattern in accordance with the lower electrode layer (25) as a base separated into the set of segments, applying an ion doping over a whole area of element regions, forming element separating regions (34) in the compound-semiconductor thin film (24), removing the resist layer (27) for exposure of surfaces of a set of compound-semiconductor thin films (24) pixel-wise separated by the element separating regions (34), and forming a transparent electrode layer (26) in a planarizing manner over a whole area of element regions.

9 Claims, 10 Drawing Sheets

(a)

(b)

(c)

(d)

(e)

(f)

(g)

(a)

(b)

SOLID-STATE IMAGING DEVICE AND FABRICATION METHOD THEREOF

TECHNICAL FIELD

The present invention relates to a solid-state imaging device, and a fabrication method thereof, and particularly, to a solid-state imaging device with a photoelectric converter including a compound-semiconductor thin film of chalcopyrite structure composed of $Cu(In,Ga)Se_2$, and a fabrication method thereof.

BACKGROUND ART

There have been thin-film solar cells including a light absorbing layer using $CuInSe_2$ being a compound-semiconductor thin film of a chalcopyrite structure composed of a Group-Ib, a Group-IIIb, and a Group-VIb element (that is a CIS-based thin film), or $Cu(In,Ga)Se_2$ being a solid solution thereof with Ga as a solute (that is a CIGS-based thin film). They have been adapted for high efficiencies of energy conversion with reduced deteriorations of efficiency such as due to light irradiation, as an advantage.

For CIS-based thin films being a compound-semiconductor thin film of chalcopyrite structure, or for CIGS-based thin films being a solid solution thereof with Ga as a solute, typically implemented has been a film formation at 550° C. in view of a film quality not to be deteriorated and leak currents not to be increased. It has been considered that at lower temperatures than 550° C. the formation would produce smaller particle diameters, degrading dark current characteristics. It is noted that semiconductor integrated circuits have heat resistant limits about 400° C.

There have been literatures (cf. e.g. Patent Literature 1) disclosing solid-state imaging devices including thin film transistors as switching elements formed on a substrate, and an amorphous semiconductor layer as a sensor region laminated thereon, with interposed pixel electrodes connected to the switching elements, as well as solid-state imaging devices having the above-noted substrate made up by an insulating substrate.

According to the Patent Literature 1, those solid-state imaging devices have the amorphous semiconductor layer employed as a photo sensor region, rendering target wavelengths of photoelectric conversion mostly within a visible wavelength band.
Patent Literature 1: Japanese patent Application Laying-Open Publication No. 2001-144279

DISCLOSURE OF INVENTION

Technical Problem

CIS-based thin films and CIGS-based thin films have their applications now mainstreaming to solar cells.
On the other hand, the inventors hereof have focused attentions on materials of such compound-semiconductor thin films having high light-absorption coefficients, as well as their characteristic high-sensitivities over a wide wavelength band ranging from visible wavelengths to near-infrared wavelengths, and examined use of such compound-semiconductor thin film materials as an image sensor for, among others, security cameras (as cameras adapted to serve in daytime for sensing visible wavelengths and in nighttime for sensing near-infrared wavelengths), person identification cameras (as cameras adapted to serve for identification of persons by near-infrared wavelengths free of influences from external light), or vehicular cameras (as cameras vehicle-mounted to serve for nighttime vision aid or distant-sight security).

It is an object of the present invention to provide a solid-state imaging device with a planarized structure having enhanced light reception efficiencies, allowing for high sensitivities over a wide wavelength band ranging from visible wavelengths to near-infrared wavelengths, and a fabrication method of the same.

It also is an object of the present invention to afford provision of a solid-state imaging device with a facilitated formation of miniature patterns, and a fabrication method of the same.

It also is an object of the present invention to afford provision of a solid-state imaging device with enhanced dark current characteristics, and a fabrication method of the same.

Solution to Problem

To achieve the objects described, according to an aspect of the present invention, there is a solid-state imaging device comprising circuitry formed on a substrate, a lower electrode layer disposed on the circuitry and configured as a set of segments separated from each other between column-wise or row-wise neighboring pixels, a set of compound-semiconductor thin films of chalcopyrite structure disposed on the lower electrode layer and configured as a set of segments separated from each other between column-wise or row-wise neighboring pixels, and a transparent electrode layer disposed on the set of compound-semiconductor thin films and planarized in structure between neighboring pixels, the lower electrode layer, the set of compound-semiconductor thin films, and the transparent electrode layer being stacked in order on the circuitry.

To achieve the objects described, according to another aspect of the present invention, there is a fabrication method for solid-state imaging devices comprising steps of having circuitry formed on a substrate, forming a lower electrode layer on the circuitry, patterning the lower electrode layer to separate pixel-wise into a set of segments, forming a compound-semiconductor thin film of chalcopyrite structure over a whole area of element regions, applying a resist layer on the compound-semiconductor thin film to pixel-wise pattern in accordance with the lower electrode layer as a base separated into the set of segments, applying an ion doping over a whole area of element regions, forming element separating regions in the compound-semiconductor thin film, removing the resist layer for exposure of surfaces of a set of compound-semiconductor thin films separated pixel-wise by the element separating regions, and forming a transparent electrode layer in a planarizing manner over a whole area of element regions.

Advantageous Effects of Invention

According to the present invention, it is possible to provide a solid-state imaging device with a planarized structure having enhanced light reception efficiencies, allowing for high sensitivities over a wide wavelength band ranging from visible wavelengths to near-infrared wavelengths, and a fabrication method of the same.

The present invention affords provision of a solid-state imaging device with a facilitated formation of miniature patterns, and a fabrication method of the same.

The present invention affords provision of a solid-state imaging device with enhanced dark current characteristics, and a fabrication method of the same.

REFERENCE SIGNS LIST

1: Package substrate;
2: Bonding pad;
3: Aluminum electrode layer;
4: Bonding pad connection;
5: Pixel;
10: Semiconductor substrate;
12: Source or drain diffusion layer;
14: Gate insulation film;
16: Gate electrode;
17: VIA0 electrode;
18: Wiring layer;
20, 34: Interlayer insulation film;
22, 23: VIA1 electrode;
24: Compound-semiconductor thin film (CIGS film);
25: Lower electrode layer;
26: Transparent electrode layer;
27: Resist layer;
28: Photoelectric converter;
30: Circuitry;
32, 33: VIA electrode;
34: Element separating region;
36: Buffer layer.

BEST MODE FOR CARRYING OUT THE INVENTION

Next, embodiments of the present invention will be described with reference to the drawings. Like blocks or elements will be designated at like reference signs, omitting redundancy for simplified description. It is noted that the drawings are schematic, and different from what is actual. It also is noted that between drawings, dimensional relationships or proportions may be different.

The following embodiments are each illustrative as a device and/or a method to implement a technical concept of the present invention, so each embodiment of the present invention is not specific to what follows in any matter with arrangement of components inclusive. The embodiments of the present invention may be changed or modified in various manners without departing from the scope of claims.

First Embodiment

Element Structure

Figure 1:
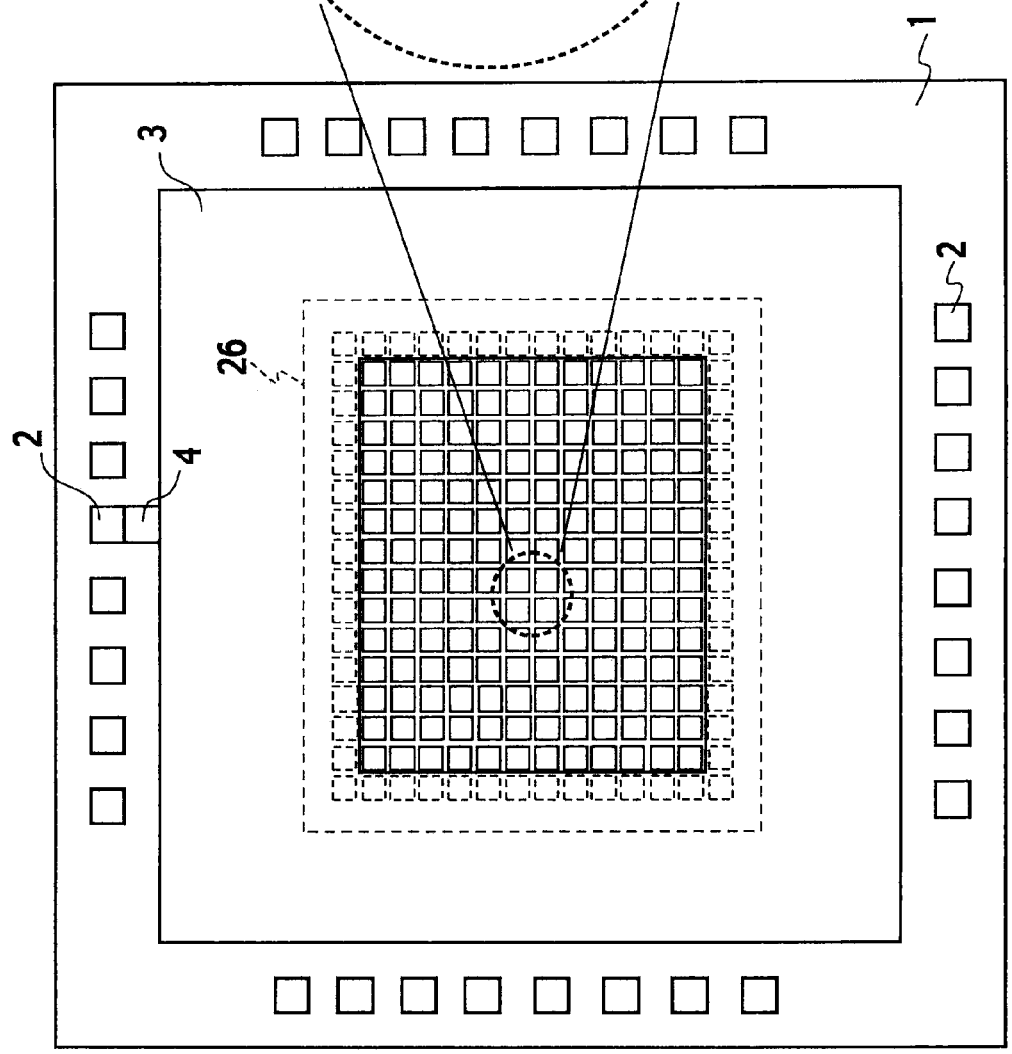
FIG. 1 is a schematic plan view of pattern configuration of a solid-state imaging device according to a first embodiment of the present invention.

FIG. 1 shows a schematic configuration of an entire planar pattern of a solid-state imaging device according to a first embodiment of the present invention that includes a package substrate 1, arrays of bonding pads 2 arranged on peripheral sides of the package substrate 1, and an aluminum electrode layer 3 connected through a bonding pad connection 4 to a bonding pad 2, the aluminum electrode layer 3 being connected along peripheral sides of the solid-state imaging device with a transparent electrode layer 26 disposed over a set of pixels 5 as elements of pix of the solid-state imaging device. That is, the transparent electrode layer 26 is covered along edge regions thereof with the aluminum electrode layer 3, and the aluminum electrode layer 3 is connected through the bonding pad connection 4 to the bonding pad 2. FIG. 1 illustrates an example of pixels 5 arranged in a matrix form.

Figure 2:
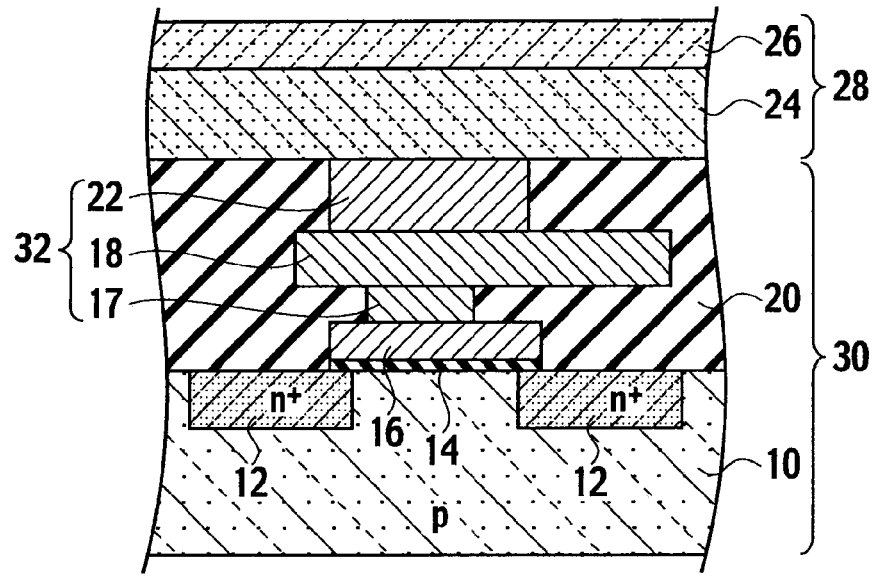
FIG. 2 is a schematic sectional view of structure of the solid-state imaging device according to the first embodiment of the present invention.

FIG. 2 shows a schematic sectional configuration of the solid-state imaging device according to the first embodiment of the present invention that has circuitry 30 as a portion formed over a substrate, and a photoelectric converter 28 as a portion disposed over the circuitry 30.

The photoelectric converter 28 is configured with a set of compound-semiconductor thin films of chalcopyrite structure ($Cu(In_x,Ga_{1-x})Se_2$ ($0 \leq x \leq 1$)) 24 adapted to work as a light absorbing layer, and the transparent electrode layer 26 arranged over the set of compound-semiconductor thin films 24.

The transparent electrode layer 26 is configured with a non-doped ZnO (i-ZnO) film disposed on the set of compound-semiconductor thin films 24, and an $n^+$-type ZnO film disposed on the non-doped ZnO (i-ZnO) film.

The circuitry 30 may be made up, for instance, by a CMOS-FET (Complementary Metal Oxide Semiconductor Field Effect Transistor) integrated circuit or the like.

Figure 3:
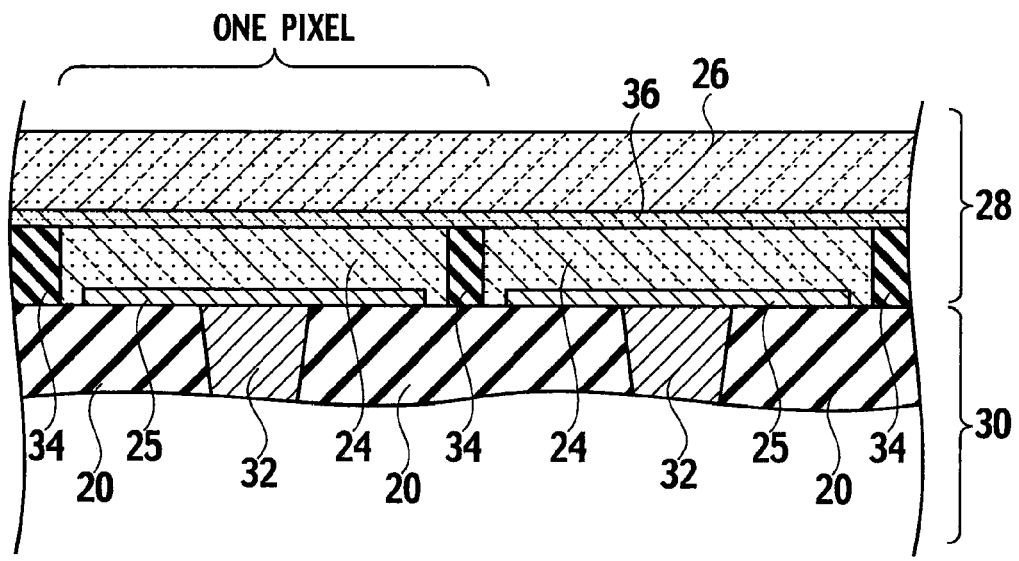
FIG. 3 is a schematic sectional view of structure of the solid-state imaging device according to the first embodiment of the present invention, with neighboring pixels inclusive.

As illustrated by FIG. 2 and FIG. 3, the solid-state imaging device according to the first embodiment includes the circuitry 30 formed on a substrate 10, a lower electrode layer 25 disposed on the circuitry 30 and configured as a set of segments separated from each other between pixels neighboring in a column direction or a row direction, a set of compound-semiconductor thin films of chalcopyrite structure 24 disposed on the lower electrode layer 25 and configured as a set of segments separated from each other between pixels neighboring in the column direction or the row direction, a buffer layer 36 disposed on the set of compound-semiconductor thin films 24, and the transparent electrode layer 26 disposed on the buffer layer 36 and planarized in structure between neighboring pixels. As used herein, the column direction means a direction of extension of bit lines arranged to read signals of pixels, and the row direction means a direction of extension of word lines arranged as address lines to pixels, that is, a direction perpendicular to the column direction.

For the lower electrode layer 25, there may be use of, for instance, molybdenum (Mo), niobium (Nb), tantalum (Ta), tungsten (W), etc.

In FIG. 2 there is part of the circuitry 30 illustrated with an n channel MOS transistor constituting a portion of CMOS that includes a semiconductor substrate 10, source or drain regions 12 formed in the semiconductor substrate 10, a gate insulation film 14 disposed on a region of the semiconductor substrate 10 between the source or drain regions 12, a gate electrode 16 disposed on the gate insulation film 14, a VIA0 electrode 17 disposed on the gate electrode 16, a gate addressing wiring layer 18 disposed on the VIA0 electrode 17, and a VIA1 electrode 22 disposed on the wiring layer 18.

The gate electrode 16, the VIA0 electrode 17, the wiring layer 18, and the VIA1 electrode 22 are all built in an interlayer insulation film 20.

There is a VIA electrode 32 made up as a combination of VIA0 electrode 17, wiring layer 18 disposed on the VIA0 electrode 17, and VIA1 electrode 22 disposed on the wiring layer 18, the VIA electrode 32 being disposed on the gate electrode 16. Such VIA electrodes 32 are illustrated also in a section of configuration depicted in FIG. 3, as well as in FIG. 12 to be described later on.

The solid-state imaging device has therein VIA electrodes 32 disposed on gate electrodes 16 and each adapted to serve for electrical connection between the photoelectric converter 28 and a gate electrode 16 of an n channel MOS transistor constituting a portion of CMOS.

The photoelectric converter 28 is configured with a set of photodiodes each connected at an anode thereof to a gate electrode 16 of an n channel MOS transistor, so optical information detected at the photodiode is amplified by the n channel MOS transistor.

It is noted that in FIG. 2, the circuitry 30 is illustrated as an example of semiconductor integrated circuit disposed on a semiconductor substrate 10, while it may be built in the form of a thin film transistor integrated circuit as an integration of thin film transistors formed on a thin film formed on a glass substrate, for instance.

The solid-state imaging device has a sectional configuration detailed in FIG. 3 with neighboring pixels inclusive, where it has the circuitry 30 as a portion formed on the semiconductor substrate 10, and the photoelectric converter 28 as a portion disposed on the circuitry 30.

The photoelectric converter 28 includes the lower electrode layer 25, the set of compound-semiconductor thin films of chalcopyrite structure ($Cu(In_x,Ga_{1-x})Se_2$ ($0 \leq x \leq 1$)) 24 disposed on the lower electrode layer 25 and adapted to work as a light absorbing layer, the buffer layer 36 disposed on the set of compound-semiconductor thin films 24, and the transparent electrode layer 26 disposed on the buffer layer 36 and planarized in structure between neighboring pixels.

The lower electrode layer 25 is connected through VIA electrodes 32 to gate electrodes 16 of MOS transistors in the circuitry 30.

As apparent from FIG. 3, the lower electrode layer 25 is configured as a set of segments separated from each other between neighboring pixels with interlayer insulation films 34 in between, as well as the set of compound-semiconductor thin films 24 disposed on the lower electrode layer 25.

The buffer layer 36 is integrally formed over a whole area of semiconductor substrate surface, to dispose on the set of compound-semiconductor thin films 24.

The transparent electrode layer 26 is integrally formed over a whole area of semiconductor substrate surface, and electrically commonized.

According to this configuration, provision of the non-doped ZnO (i-ZnO) film as a transparent electrode layer 26 affords to plug occasional voids or pinholes in the set of CIGS thin films as a base thereof with a semi-insulating layer, while preventing leakage. Accordingly, the depth of non-doped ZnO (i-ZnO) film may well be increased to thereby reduce dark currents at p-n junction boundary surfaces. It is noted that the lower electrode layer 25 and the buffer layer 36 depicted in FIG. 36 are non-depicted in FIG. 2.

As a material for formation of the buffer layer 16, there may be use of CdS, ZnS, ZnO, ZnSe, $In_2S_3$, etc.

As to the transparent electrode layer 26, other electrode materials may be applied. For instance, there may be use of an ITO film, a tin oxide ($SnO_2$) film, or an indium oxide ($In_2O_3$) film.

The solid-state imaging device according to the first embodiment of the present invention may be configured as a photo sensor to be sensitive within a band covering near-infrared wavelengths, as well.

The buffer layer 36 is integrally formed in a planarizing manner over a whole area of semiconductor substrate surface, to dispose on the set of compound-semiconductor thin films 24 and element separating regions 34.

Further, in a set of integrated pixels, the transparent electrode layer 26 is integrally formed in a planarizing manner over the area of semiconductor substrate surface, and electrically commonized.

That is, the transparent electrode layer 26 serves as a cathode electrode for photodiodes (PD) constituting the photoelectric converter 28, and has a constant potential (e.g. ground potential). In this regard, in the set of integrated pixels, the cathode electrode for photodiodes (PD) constituting the photoelectric converter 28 is not required to form in any segment separating manner, so it is integrally formed over the area of semiconductor substrate surface, and electrically commonized.

(Fabrication Method)

Figure 4:
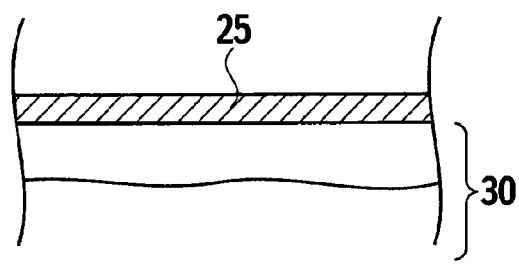
FIG. 4 is a series of illustrations of activities in processes in a fabrication method for solid-state imaging devices according to the first embodiment of the present invention, in which (a) is an illustration of an activity in a process of sputtering a lower electrode layer (Mo), (b) is an illustration of an activity in a process of etching the lower electrode layer (Mo), (c) is an illustration of an activity in a process of pattering a resist layer coated on a compound-semiconductor thin film of chalcopyrite structure (CIGS thin film) formed to function as a light absorbing layer, (d) is an illustration of an activity in a process of doping impurities (ion doping) to the compound-semiconductor thin film (CIGS thin film) to form element separating regions, (e) is an illustration of an activity in a process of polishing the resist layer, (f) is an illustration of an activity in a process of solution growth of a buffer layer (CdS layer), and (g) is an illustration of an activity in a process of sputtering a transparent electrode layer (ZnO film).
Figure 4:
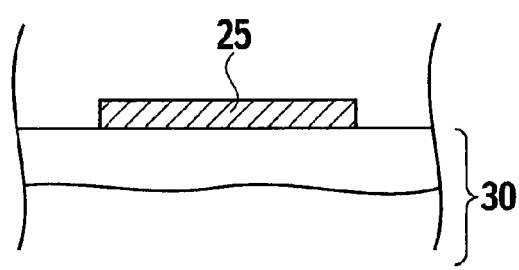
Figure 4:
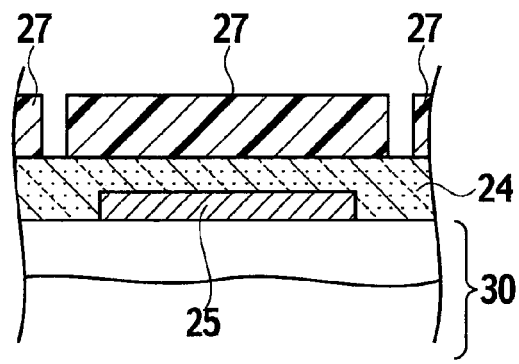
Figure 4:
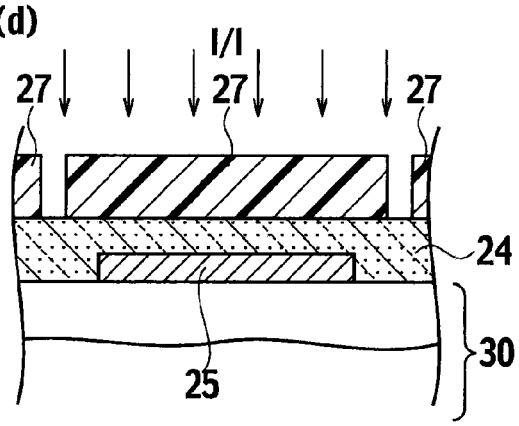
Figure 4:
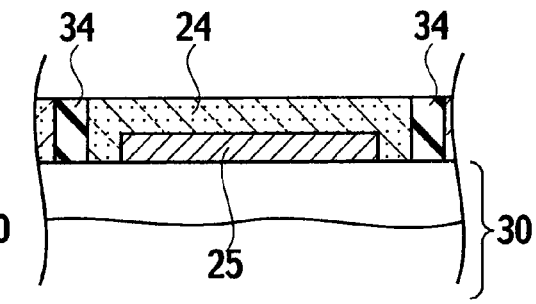
Figure 4:
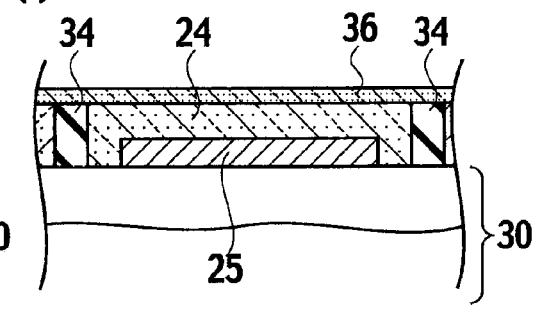
Figure 4:
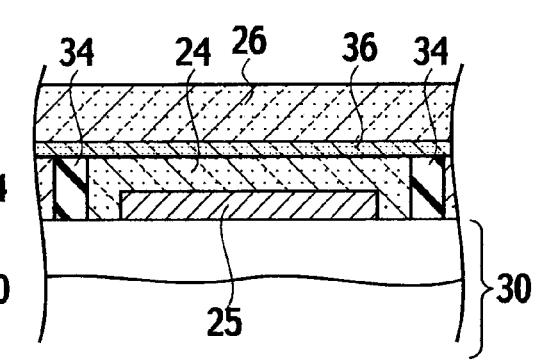

FIG. 4 illustrates a fabrication method for solid-state imaging devices according to the first embodiment that includes a step of having circuitry 30 formed on a substrate, a step of forming a lower electrode layer 25 on the circuitry 30, a step of patterning the lower electrode layer 25 to separate pixel-wise into a set of segments, a step of forming a compound-semiconductor thin film of chalcopyrite structure 24 over a whole area of element regions, a step of applying a resist layer 27 on the compound-semiconductor thin film 24 to pixel-wise pattern in accordance with the lower electrode layer 25 as a base separated into the set of segments, a step of applying an ion doping over a whole area of element regions, forming element separating regions 34 in the compound-semiconductor thin film 24, a step of removing the resist layer 27 for exposure of surfaces of a set of compound-semiconductor thin films 24 separated pixel-wise by the element separating regions 34, and a step of forming a transparent electrode layer 26 in a planarizing manner over a whole area of element regions.

There may be an additional step of forming a buffer layer 36 in a planarizing manner over a whole area of element regions after the exposure of the surfaces of the set of compound-semiconductor thin films 24.

The forming the compound-semiconductor thin film of chalcopyrite structure 24 may include making a thin film of $Cu(In_x, Ga_{1-x})Se_2$ ($0 \leq X \leq 1$) using a PVD (Physical Vapor Deposition) method. As used herein, the PVD method refers to any method of depositing a vacuum-vaporized raw material to make a film.

There may be an additional step of forming a color filter on the transparent electrode layer 26.

The forming the transparent electrode layer 26 may include forming a non-doped ZnO film, and forming an n-type ZnO film or an ITO film as a transparent electrode film on the non-doped ZnO film.

Description is now made of processes in the fabrication method for solid-state imaging devices according to the first embodiment, with reference to a series of schematic illustrations of process activities in FIG. 4.

(a) First, as illustrated in FIG. 4(a), on circuitry 30 such as a CMOS integrated circuit formed on a semiconductor substrate, there is a layer of e.g. molybdenum (Mo) formed as a lower electrode layer 25 by using a technique such as a sputtering. The lower electrode layer 25 has a thickness of approximately 0.3 µm or near, for instance.

(b) Next, as illustrated in FIG. 4(b), the lower electrode layer 25 made as a layer of molybdenum (Mo) is processed by application of a patterning followed by an etching to separate pixel-wise into a set of segments.

(c) Next, as illustrated in FIG. 4(c), there is a compound-semiconductor thin film of chalcopyrite structure (CIGS thin film) 24 formed over a whole area of element regions, with adaptation to work as a light absorbing layer. For formation of the compound-semiconductor thin film (CIGS thin film) 24, the process employed may be a three-stepped sputtering process using an ion beam sputtering method, as will be illustrated by later-described charts in FIG. 5. The compound-semiconductor thin film (CIGS thin film) 24 has a thickness of approximately 1.0 µm or near, for instance.

(d) Next, as illustrated in FIG. 4(c), there is a resist layer 27 applied as a coat on the compound-semiconductor thin film 24 and pixel-wise patterned thereafter in accordance with the lower electrode layer 25 as a base separated into the set of segments.

(e) Next, as illustrated in FIG. 4(d), there is application of an ion doping made over a whole area of element regions, forming a system of element separating regions 34 in the compound-semiconductor thin film 24.

For the ion doping, material species of impurity ions employed may mostly be e.g. Group-II and Group-VII elements acting as donor impurities, or such. More specifically, material species employed may encompass e.g. magnesium (Mg), chlorine (Cl), zinc (Zn), bromine (Br), cadmium (Cd), etc. As else than those, material species employed may encompass e.g. phosphorus (P), antimony (Sb), xenon (Xe), bismuth (Bi), etc.

For the ion doping, the dose amount and the acceleration voltage are variable depending on ion-doping elements, e.g., within 100 keV to 400 keV or near for acceleration voltage, and within $10^{15}$ to $10^{17}$ ($cm^{-3}$) or near for dose amount.

(f) Next, as illustrated in FIG. 4(e), the resist layer is removed for exposure of surfaces of a set of compound-semiconductor thin films 24 as segments pixel-wise separated by the system of element separating regions 34.

(g) Next, as illustrated in FIG. 4(f), there is a buffer layer (window layer) 36 made by using a solution-growth technique, as a thin CdS film (about 50 nm thick) for instance. Use of the solution-growth technique permits the buffer layer 36 to be made as a film with an enhanced coatability.

(h) Next, as illustrated in FIG. 4(g), there is a transparent electrode layer (ZnO film) 26 formed as a film by using a sputtering method. The buffer layer 36 then works to reduce damages to the set of compound-semiconductor thin films 24.

The transparent electrode layer (ZnO film) 26 is made up by consecutive film formation of a non-doped ZnO (i-ZnO) film and a low-resistivity ZnO ($n^+$) film doped with n-type impurities. The i-ZnO film has a thickness of approximately 60 nm or near, while the low-resistivity ZnO ($n^+$) film has a thickness of approximately 0.5 µm or near.

The non-doped ZnO (i-ZnO) film serves to plug occasional voids or pinholes in CIGS thin films 24 as bases thereof with a semi-insulating layer, thus preventing leak currents.

It therefore is possible to provide the non-doped ZnO (i-ZnO) film with an increased film thickness to thereby reduce dark currents at p-n junction boundary surfaces. However, even when thickened, the film is considered to be still thin enough (e.g. approximately 60 nm or near) to constitute substantial p-n junctions between the low-resistivity ZnO ($n^+$) film working as a transparent electrode layer 26 and the set of CIGS thin films ($p^-$).

(i) Finally, there comes a process of attaching electrodes. This is similar to an electrode attaching process in a typical CMOS fabrication process, and description thereof is omitted. It is noted that the transparent electrode layer (ZnO film) 26 gets equi-potential, and does not need any pixel-wise segment separation, while instead for area sensors of which the capacity is so large as the resistivity comes to an issue, there may well be use of a set of electrodes made of aluminum or the like to be arranged in a mesh form or in a striped form at constant pitches over the transparent electrode layer (ZnO film) 26 within an extent not to affect the aperture ratio of pixels.

(j) Further, there may be a set of color filters disposed on the transparent electrode layer (ZnO film) 26, for sensing color images in a band or bands of visible wavelengths. There may be use of a triplet of color filters addressed to red, green, and blue colors to arrange on neighboring pixels 5. There may be addition of a near-infrared addressing filter to constitute a quartet. Such quartets may be arranged in the form of a 2×2 matrix. There may be color filters made of a multi-layered gelatin film, for instance.

(Process of Forming a Compound-Semiconductor Thin Film of Chalcopyrite Structure)

The compound-semiconductor thin film of chalcopyrite structure to be adapted to work as a light absorbing layer may be formed by use of, among others, a vacuum vapor deposition method referred to as a PVD method and a sputtering method on, among others, a semiconductor substrate or a glass substrate formed with circuitry 30.

For use of the vacuum deposition method, there may be a set of vacuum deposition sources adapted for individual vacuum deposition of compound components (Cu, In, Ga, Se) on a substrate formed with circuitry 30.

For the sputtering method, there may be use of a chalcopyrite compound as a target, or use of components thereof as individual targets.

For formation of a compound-semiconductor thin film of chalcopyrite structure on a glass substrate formed with circuitry 30, the substrate may be heated to high temperatures causing composition changes due to defection of a chalcogenide element. In such a case, preferably, as-made films should be heat-treated in a Se or S vapor atmosphere at temperatures of 400° C. to 600° C. for a period within a range of one to several hours (for a selenidation or sulfurization process) to supplement Se or S.

Figure 5:
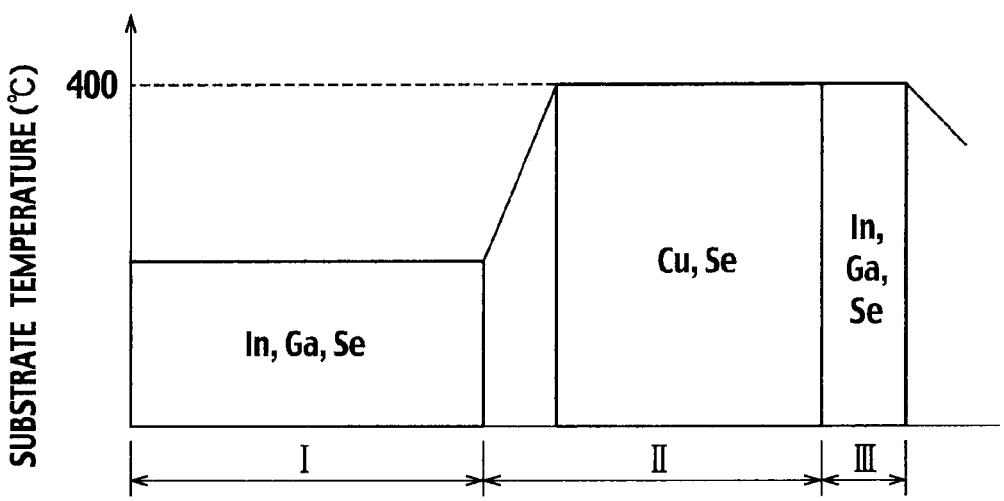
FIG. 5 is a pair of time charts for detailed explanation of a process of forming a compound-semiconductor thin film of chalcopyrite structure applicable to solid-state imaging devices according to the first embodiment of the present invention, in which (a) is a time chart showing for each step a substrate temperature and ion species in formation of film using an ion beam sputtering method, and (b) is a time chart showing a composition ratio of (Cu/(In+Ga)) for each step.
Figure 5:
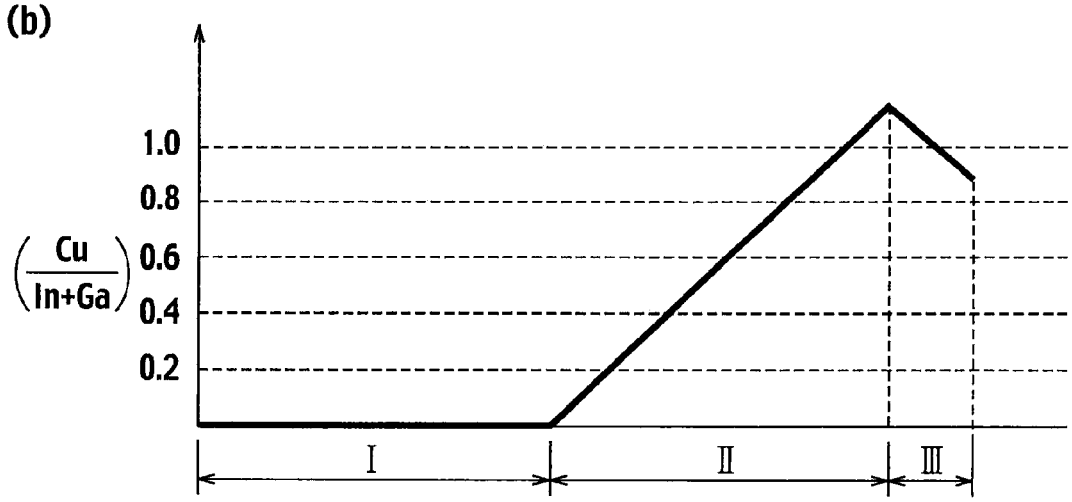

FIG. 5 shows an exemplary process of forming a compound-semiconductor thin film of chalcopyrite structure applicable to solid-state imaging devices according to the first embodiment.

As illustrated by FIG. 5, the exemplary process is divided into three steps being a step I, a step II, and a step III, for a composition-controlled p-type CIGS film ($Cu(In_x,Ga_{1-x})Se_2$ ($0 \leq x \leq 1$)) to be formed by using an ion beam sputtering method, for instance. FIG. 5(*a*) shows for each step a substrate temperature or substrate temperatures and ion species in formation of film using the ion beam sputtering method. FIG. 5(*b*) shows for each step a composition ratio or composition ratios of (Cu/(In+Ga)). The proportion of In and Ga is controlled as necessary as described later on. The substrate temperature is set, even at a maximum, to approximately 400° C. or near, for instance.

First, at the step I, the composition ratio of (Cu/(In+Ga)) is held as it is a 0 in an excessive state of Group-III elements.

Next, as the step II proceeds, the composition ratio of (Cu/(In+Ga)) is shifted from the 0 to a 1.0 or more being a Cu element excessive state.

Next, as the step III proceeds, the composition ratio of (Cu/(In+Ga)) is shifted from the 1.0 or more being the Cu element excessive state to a 1.0 or less being a Group-III element excessive state, to form a desirable compound-semiconductor thin film of chalcopyrite structure ($Cu(In_x,Ga_{1-x})Se_2$ ($0 \leq x \leq 1$)). In this embodiment, the compound-semiconductor thin film 24 is formed at temperatures about 400° C. or less, as described. Given a substrate temperature high enough, respective component elements can be mutually diffused.

(Energy Band Structure)

Figure 6:
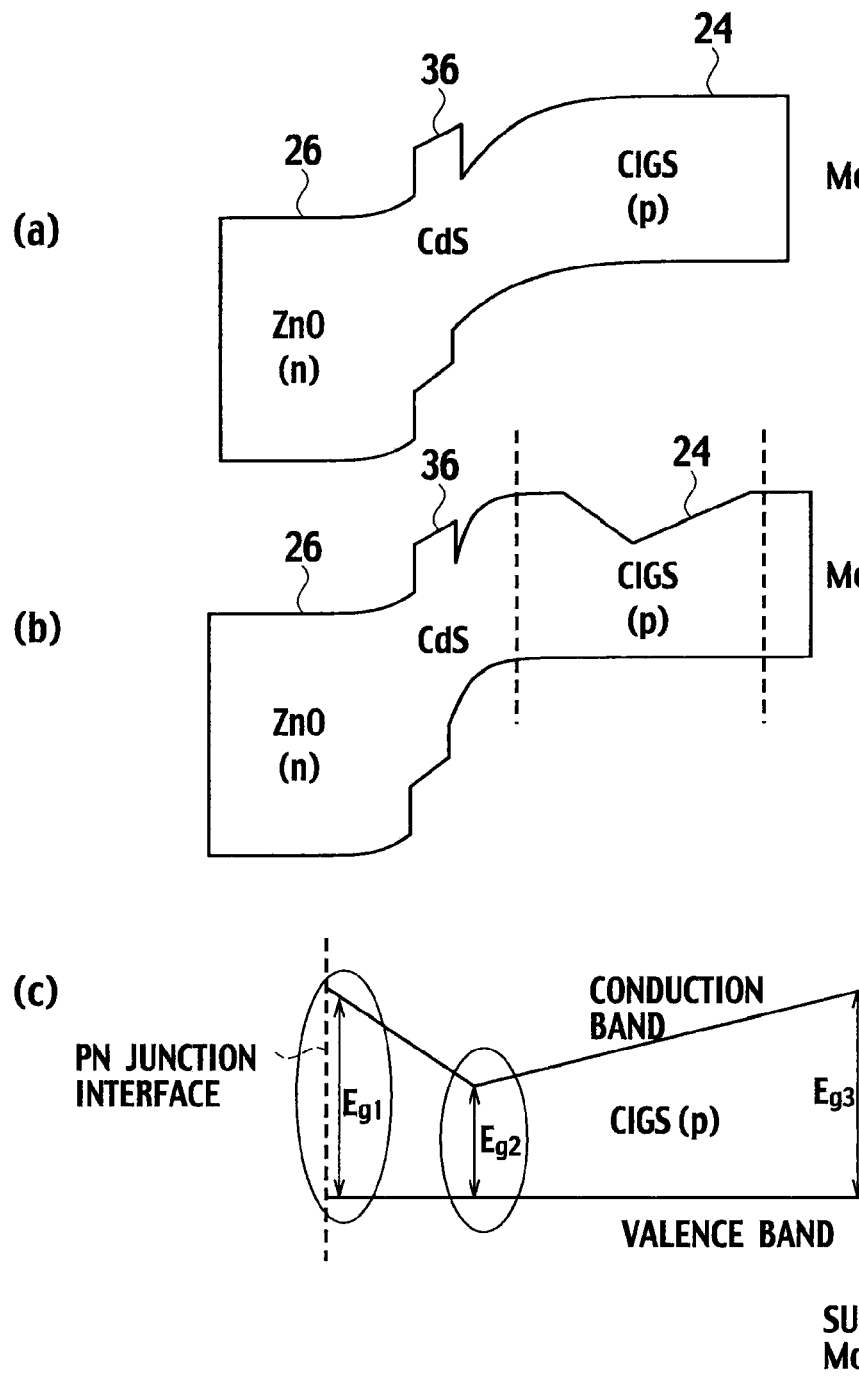
FIG. 6 is a set of schematic illustrations of energy band structures in a photoelectric converter of a solid-state imaging device according to the first embodiment of the present invention, in which (a) is a schematic illustration of an energy band structure after formation with a CIGS thin film having an even composition, (b) is a schematic illustration of an energy band structure after bandgap control, and (c) is an enlarged illustration of a detailed energy band structure at a CIGS (p) thin film 24 after bandgap control.

FIG. 6 is a set of schematic illustrations of energy band structures in photoelectric converters of solid-state imaging devices.

Namely, FIG. 6(*a*) illustrates an energy band structure that one photoelectric converter composed of ZnO (n)/CdS/CIGS (p) has at a p-n junction thereof in a state of thermal equilibrium after formation with the CIGS thin film having an even composition, and FIG. 6 (*b*) illustrates an energy band structure that another photoelectric converter composed of ZnO (n)/CdS/CIGS (p) has at a p-n junction thereof in a state of thermal equilibrium after a bandgap control. FIG. 6(*c*) is an enlarged illustration of a detailed energy band structure at a CIGS (p) thin film 24 after the bandgap control of FIG. 6(*b*).

Large bad gaps work to reduce leak currents, decreasing dark currents. On the other hand, small bad gaps work to increase photoelectric conversion efficiencies.

In a respective solid-state imaging device, the photoelectric converter may thus have CIGS thin films thereof composition-controlled to control bandgap profiles, allowing for reduced dark currents with an enhanced photoelectric conversion characteristic in a prescribed wavelength band.

For example, as shown in FIG. 6(*c*), in order for dark currents to be reduced, the compound-semiconductor thin film of chalcopyrite structure ($Cu(In_x,Ga_{1-x})Se_2$ ($0 \leq x \leq 1$)) 24 may be composition-controlled to render Ga excessive in vicinities of p-n junction boundary surfaces as well as in vicinities of Mo electrode surfaces, to have increased energy gaps $E_{g1}$ and $E_{g3}$ as illustrated in the figure.

On the other hand, in order for photoelectric conversion efficiencies to be enhanced in a band of near-infrared wavelengths up to 1,300 nm or near, the compound-semiconductor thin film of chalcopyrite structure ($Cu(In_x,Ga_{1-x})Se_2$ ($0 \leq x \leq 1$)) 24 may be composition-controlled to render In excessive in a prescribed depth range, to have a decreased energy gap $E_{g2}$ as illustrated in the figure.

It is noted that in operation of the solid-state imaging device, the n-type transparent electrode layer (ZnO film) 26 and the set of p-type CIGS thin films 24 have, for instance, a reverse bias voltage applied in between to detect pixel information.

Figure 7:
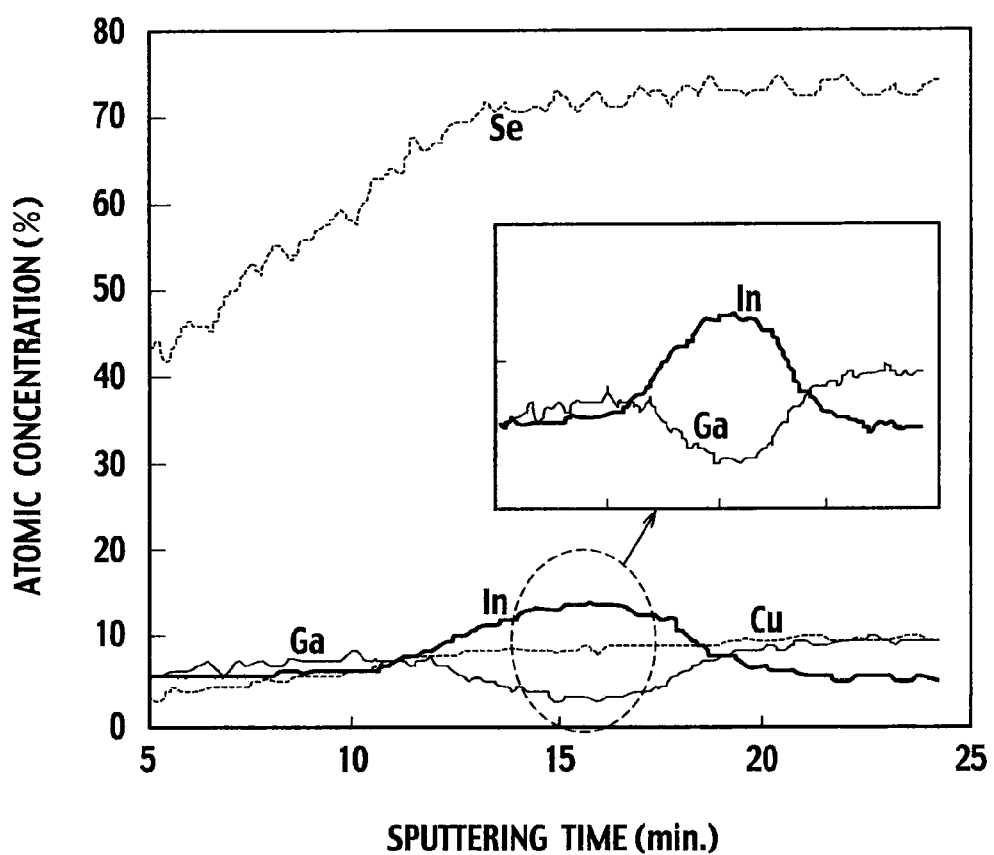
FIG. 7 is a plot of relationships between a sputtering time and atomic concentrations (%) as a result of analysis using an AES (Auger Electron Spectroscopy) at a compound-semiconductor thin film (CIGS thin film) in a photoelectric converter formed by a fabrication method for solid-state imaging devices according to the first embodiment of the present invention.

FIG. 7 plots relationships between a sputtering time and atomic concentrations (%) as a result of analysis using an AES (Auger Electron Spectroscopy) at a compound-semiconductor thin film (CIGS thin film) in a photoelectric converter formed by the fabrication method for solid-state imaging devices.

The compound-semiconductor thin film (CIGS thin film) is formed in a photoelectric converter, with an In excessive region at a prescribed depth.

(Characteristics on Band Gap Energy and In/(In+Ga) Composition Ratio)

Figure 8:
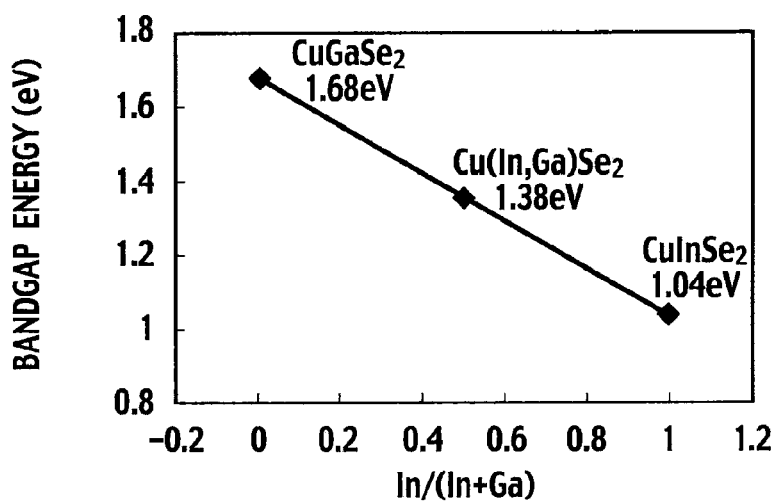
FIG. 8 is a plot of a dependency characteristic between bandgap energy and In/(In+Ga) composition ratio of compound-semiconductor thin films of chalcopyrite structures applicable to solid-state imaging devices according to the first embodiment of the present invention.

FIG. 8 shows, in a graph, a dependency characteristic between bandgap energies and composition ratios of In/(In+Ga) in compound-semiconductor thin films of chalcopyrite structure ($Cu(In_x,Ga_{1-x})Se_2$ ($0 \leq x \leq 1$)) applicable to solid-state imaging devices.

Plotted in FIG. 8 was Cu (Ga)$Se_2$ with a band gap energy of 1.68 eV, Cu(In,Ga)$Se_2$ with a band gap energy of 1.38 eV, and Cu(In)$Se_2$ with a band gap energy of 1.04 eV.

Compound-semiconductor thin films of chalcopyrite structure ($Cu(In_x,Ga_{1-x})Se_2$ ($0 \leq x \leq 1$)) have their In/(In+Ga) composition ratios, which are controllable to change their bandgap energies as shown in FIG. 8, so their photo-electric conversion wavelengths are variable by composition ratio control.

(Photoelectric Conversion Characteristic)

Figure 9:
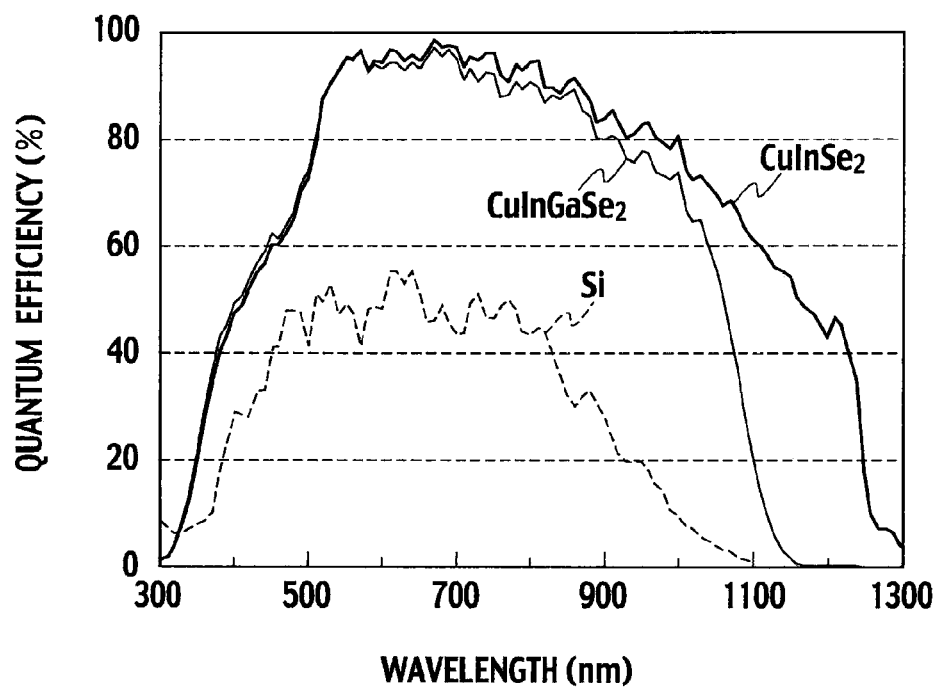
FIG. 9 is a plot of quantum efficiency vs. wavelength characteristics for explanation of photoelectric conversion characteristics of solid-state imaging devices according to the first embodiment of the present invention.

FIG. 9 shows, in a graph, photoelectric conversion characteristics of solid-state imaging devices. Namely, there were sets of compound-semiconductor thin films of chalcopyrite structure ($Cu(In_x,Ga_{1-x})Se_2$ ($0 \leq x \leq 1$)) 24 working as light absorbing layers, exhibiting, as reflection of their quantum efficiencies, photoelectric conversion characteristics with high quantum efficiencies over a wide wavelength band encompassing from visible wavelengths to near-infrared wavelengths. The quantum efficiencies were double or more relative to a silicon (Si)-based photoelectric conversion characteristic.

The sets of compound-semiconductor thin films of chalcopyrite structure 24, working as light-absorbing layers, may have their composition ($Cu(In_x,Ga_{1-x})Se_2$ ($0 \leq x \leq 1$)) changed between $Cu(InGa)Se_2$ and $Cu(In)Se_2$ to extend the wavelength band up to near-infrared wavelengths approximately 1,300 nm.

Figure 10:
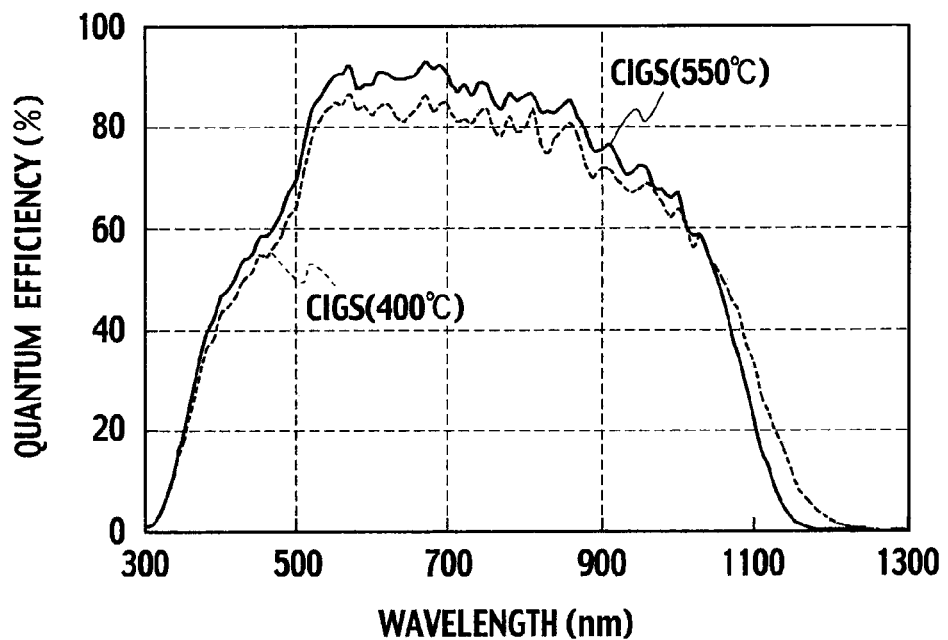
FIG. 10 is a plot of quantum efficiency vs. wavelength characteristics of compound-semiconductor thin films (CIGS thin films) formed by a fabrication method for solid-state imaging devices according to the first embodiment of the present invention.

FIG. 10 shows, in a graph, plots of quantum efficiency vs. wavelength characteristics of compound-semiconductor thin films (CIGS thin films) formed by the fabrication method for solid-state imaging devices.

In the fabrication method for solid-state imaging devices, there was a combination of composition control of compound-semiconductor thin films of chalcopyrite structure ($Cu(In_x,Ga_{1-x})Se_2$ ($0 \leq x \leq 1$)) 24 made in a process at a temperature as low as 400° C., obtaining dark current densities compatible to those of CIGS thin films formed at 550° C.

In formation of compound-semiconductor thin films ($Cu(In_x,Ga_{1-x})Se_2$ ($0 \leq x \leq 1$)), making films at 550° C. was typical in view of film quality and leak currents, so forming circuitry with a built-in semiconductor integrated circuit such as CMOS was difficult, while instead for solid-state imaging devices, the very use of composition control in formation of compound-semiconductor thin films (CIGS thin films) has enabled implementation of a low-temperature process at approximately 400° C. or near, with suppressed dark currents.

Also in wavelength characteristics of quantum efficiency of compound-semiconductor thin films (CIGS thin films) formed by the fabrication method for solid-state imaging devices, the use of composition control information of compound-semiconductor thin films (CIGS thin films) has enabled implementation of a low-temperature process at approximately 400° C. or near to obtain characteristics compatible to those of CIGS films formed at 550° C.

Figure 11:
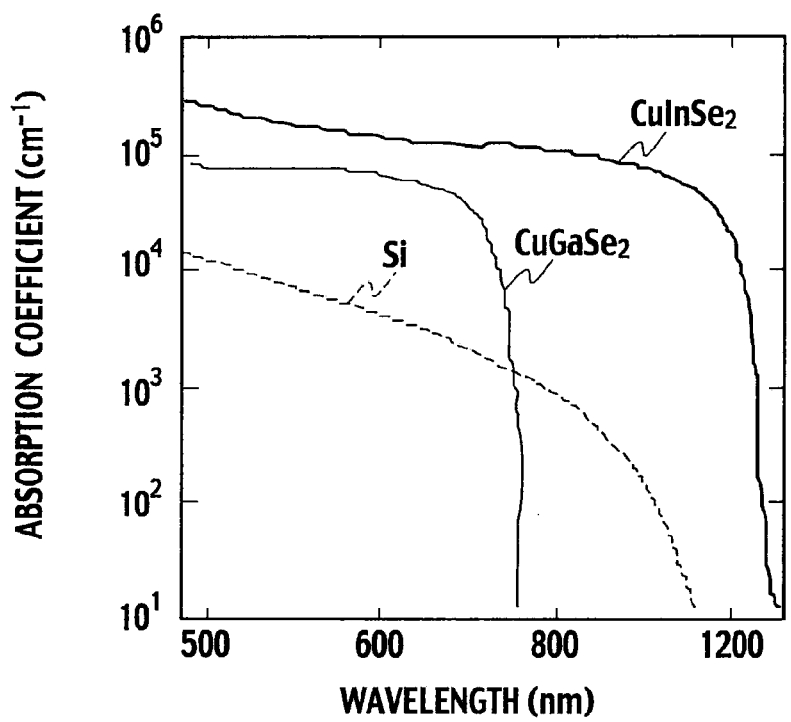
FIG. 11 is a plot of light absorbing characteristics of solid-state imaging devices according to the first embodiment of the present invention.

FIG. 11 plots light absorbing characteristics, permitting the penetration depth of light reduced to a light intensity of (1/e) to be determined from an inverse of absorption coefficient. Further, for a corresponding compound-semiconductor thin film ($Cu(In_x,Ga_{1-x})Se_2$ ($0 \leq x \leq 1$)) 24, the energy gap is obtainable from FIG. 8.

(Light Absorption Characteristic)

FIG. 11 shows, in a graph, light absorption characteristics of solid-state imaging devices. Namely, there were sets of compound-semiconductor thin films of chalcopyrite structure ($Cu(In_x,Ga_{1-x})Se_2$ ($0 \leq x \leq 1$)) 24 working as light absorbing layers, exhibiting, as reflection of their light absorption characteristics, strong absorption performances within a wide wavelength band encompassing from visible wavelengths to near-infrared wavelengths.

For instance, they had a silicon (Si)-based absorption coefficient times approximately 100 even in a visible wavelength region, so the sets of compound-semiconductor thin films of chalcopyrite structure 24, working as light absorbing layers, can have their composition of ($Cu(In_x,Ga_{1-x})Se_2$ ($0 \leq x \leq 1$)) changed between $Cu(InGa)Se_2$ and $Cu(In)Se_2$ to extend the absorption characteristic up to wavelengths approximately 1,300 nm or near.

(Modification of First Embodiment)

Figure 12:
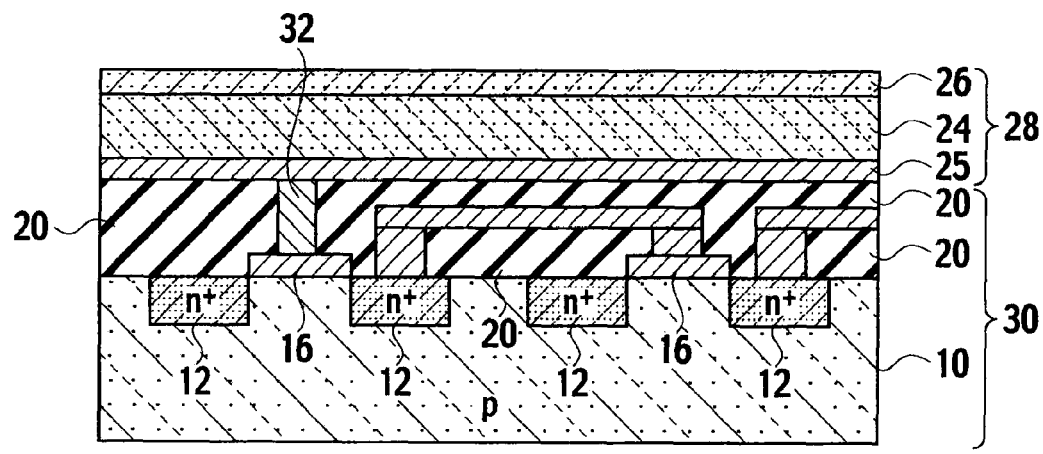
FIG. 12 is a schematic sectional view of structure at a pixel of a solid-state imaging device according to a modification of the first embodiment of the present invention.

FIG. 12 shows a section of a portion of one pixel of a solid-state imaging device according to a modification of the first embodiment of the present invention that includes circuitry 30 as a portion formed on a semiconductor substrate 10, and a photoelectric converter 28 as a portion composed of a lower electrode layer 25 disposed on the circuitry 30, a set of compound-semiconductor thin films of chalcopyrite structure ($Cu(In_x,Ga_{1-x})Se_2$ ($0 \leq x \leq 1$)) 24 disposed on the lower electrode layer 25 and configured to work as a light absorbing layer, and a transparent electrode layer 26 disposed on the set of compound-semiconductor thin films 24.

The lower electrode layer 25, the set of compound-semiconductor thin films 24, and the transparent electrode layer 26 are stacked in order on the circuitry 30.

In the solid-state imaging device, the circuitry 30 includes transistors connected at gate electrodes 16 to the lower electrode layer 25.

For the lower electrode layer 25, there may be use of, for instance, molybdenum (Mo), niobium (Nb), tantalum (Ta), tungsten (W), etc.

The transparent electrode layer 26 is configured with a non-doped ZnO (i-ZnO) film having boundary surfaces to the set of compound-semiconductor thin films 24, and an n-type ZnO film disposed on the non-doped ZnO (i-ZnO) film.

According to this configuration, provision of the non-doped ZnO (i-ZnO) film as a transparent electrode layer 26 affords to plug occasional voids or pinholes in the set of CIGS thin films as a base thereof with a semi-insulating layer, while constituting i-p junctions with the set of CIGS films, allowing for a prevented leakage by tunnel currents due to direct contact of the conductive ZnO film ($n^+$) with CIGS films. Accordingly, the depth of non-doped ZnO (i-ZnO) film may well be increased to thereby reduce dark currents at p-n junction boundary surfaces.

As to the transparent electrode layer 26, other electrode materials may be applied. For instance, there may be use of an ITO film, a tin oxide ($SnO_2$) film, or an indium oxide ($In_2O_3$) film.

In configuration shown FIG. 12, the circuitry 30 may be made up by a CMOS integrated circuit, for instance. In FIG. 12, there are non-depicted gate insulation films on regions of the semiconductor substrate 10 between source or drain regions 12. Further, between the lower electrode layer 25 and gate electrodes 16, three are VIA electrodes 32 built in an interlayer insulation film 20.

The solid-state imaging device according to the modification of the first embodiment has a set of photoelectric conversion cells configured with circuitry 30 and photoelectric converter 28, and integrated in a one-dimensional or two-dimensional matrix form.

For the set of integrated pixels, the transparent electrode layer 26 is integrally formed in a planarizing manner over the area of semiconductor substrate surface, and electrically commonized.

That is, in the solid-state imaging device according to the modification of the first embodiment, the transparent electrode layer 26 serves as a cathode electrode for photodiodes (PD) constituting the photoelectric converter 28, and has a constant potential (e.g. power supply voltage). In this regard, in the set of integrated pixels, the cathode electrode for photodiodes (PD) constituting the photoelectric converter 28 is not required to form in any segment separating manner, so it is integrally formed over the area of semiconductor substrate surface, and electrically commonized.

The solid-state imaging device according to the modification of the first embodiment has a stacked structure of circuitry 30 and photoelectric converter 28, thereby permitting the entirety of pixel regions of photoelectric conversion cells to be used as a substantial photoelectric conversion region. This affords for a CMOS image sensor to have an aperture ratio within a range of approximately 80 to 90%, as a greatly enhanced effect of improvement relative to a ratio range of approximately 30 to 40% in use of a photoelectric converter 28 built as a set of p-n junction diodes in a semiconductor substrate.

According to the first embodiment as well as the modification thereof, there is a solid-state imaging device including in a photoelectric converter 28 thereof a set of compound-semiconductor thin films of chalcopyrite structure 24 made of $Cu(In,Ga)Se_2$, thereby allowing for provision of a solid-state imaging device with high-sensitivities over a wide wavelength band ranging from visible wavelengths to near-infrared wavelengths, reduced dark currents, and a simplified structure.

According to the first embodiment as well as the modification thereof, there is a fabrication method for solid-state imaging devices permitting a transparent electrode layer 26 to be integrally formed in a planarizing manner on a substrate surface, without the need of patterning the transparent electrode layer 26, thus allowing for a simplified fabrication process.

According to the first embodiment as well as the modification thereof, there is a solid-state imaging device making use of a CIGS-based thin film having a proportion of indium (In) substituted in part by gallium, allowing for extension of band width to decrease carrier reassociation processes, reducing dark currents.

According to the first embodiment as well as the modification thereof, there is a solid-state imaging device as well as a fabrication method thereof affording to implement a planarized structure with an enhanced light receiving efficiency, allowing for an enhanced resolution.

According to the first embodiment as well as the modification thereof, there is a solid-state imaging device as well as a fabrication method thereof affording to omit an etching process to a compound-semiconductor thin film 24, thus allowing for a facilitated formation of miniature pattern.

According to the first embodiment as well as the modification thereof, there is a solid-state imaging device as well as a fabrication method thereof affording to omit etching damages to a set of compound-semiconductor thin films 24, thus allowing for an improved dark current characteristic.

According to the first embodiment as well as the modification thereof, there is a solid-state imaging device adapted to control bandgaps at $Cu(In_x,Ga_{1-x})Se_2$ ($0 \leq x \leq 1$), affording to reduce the intensity of dark current by order of $10^2$.

Second Embodiment

Element Structure

Figure 13:
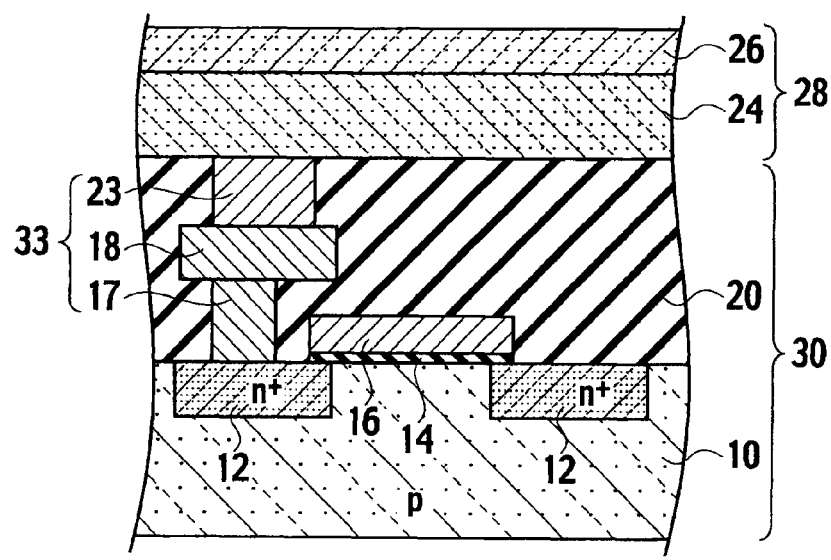
FIG. 13 is a schematic sectional view of structure of a solid-state imaging device according to a second embodiment of the present invention.

FIG. 13 shows a solid-state imaging device according to a second embodiment of the present invention that has circuitry 30 as a portion formed over a substrate, and a photoelectric converter 28 as a portion disposed over the circuitry 30.

The photoelectric converter 28 is configured with a set of compound-semiconductor thin films of chalcopyrite structure ($Cu(In_x,Ga_{1-x})Se_2$ ($0 \leq x \leq 1$)) 24 adapted to work as a light absorbing layer, and a transparent electrode layer 26 arranged over the set of compound-semiconductor thin films 24.

The transparent electrode layer 26 is configured with a non-doped ZnO (i-ZnO) film having boundary surfaces to the set of compound-semiconductor thin films 24, and an $n^+$-type ZnO film disposed on the non-doped ZnO (i-ZnO) film.

According to this configuration, provision of the non-doped ZnO (i-ZnO) film as a transparent electrode layer 26 affords to plug occasional voids or pinholes in the set of CIGS thin films as a base thereof with a semi-insulating layer, while constituting i-p junctions with the set of CIGS films, allowing for a prevented leakage by tunnel currents due to direct contact of the conductive ZnO film ($n^+$) with CIGS films. Accordingly, the depth of non-doped ZnO (i-ZnO) film may well be increased to thereby reduce dark currents at p-n junction boundary surfaces.

The circuitry 30 may be made up, for instance, by a CMOS-FET (Complementary Metal Oxide Semiconductor Field Effect Transistor) integrated circuit or the like. In FIG. 13 there is part of the circuitry 30 illustrated with an n channel MOS transistor constituting a portion of CMOS that includes a semiconductor substrate 10, source or drain regions 12 formed in the semiconductor substrate 10, a gate insulation film 14 disposed on a region of the semiconductor substrate 10 between the source or drain regions 12, a gate electrode 16 disposed on the gate insulation film 14, a VIA0 electrode 17 disposed on the source or drain regions 12, a source or drain addressing wiring layer 18 disposed on the VIA0 electrode 17, and a VIA1 electrode 23 disposed on the wiring layer 18. The VIA0 electrode 17, the wiring layer 18, and the VIA1 electrode 23 are all built in an interlayer insulation film 20.

There is a VIA electrode 33 made up as a combination of VIA0 electrode 17, wiring layer 18 disposed on the VIA0 electrode 17, and VIA1 electrode 23 disposed on the wiring layer 18, the VIA electrode 33 being disposed on a source or drain region 12. Such a VIA electrode 33 is illustrated also in a section of configuration depicted in FIG. 14 to be described later on.

The solid-state imaging device according to the second embodiment has therein VIA electrodes 33 disposed on source or drain regions 12 and each adapted to serve for electrical connection between the photoelectric converter 28 and a source or drain region 12 of an n channel MOS transistor constituting a portion of CMOS.

The photoelectric converter 28 is configured with a set of photodiodes each connected at an anode thereof to a source or drain region 12 of an n channel MOS transistor, so optical information detected at the photodiode undergoes a switching of the n channel MOS transistor.

It is noted that in FIG. 13, the circuitry 30 is illustrated as an example of semiconductor integrated circuit disposed on a semiconductor substrate 10, while it may be built in the form of a thin film transistor integrated circuit as an integration of thin film transistors formed on a thin film formed on a glass substrate, for instance.

(Modification of Second Embodiment)

Figure 14:
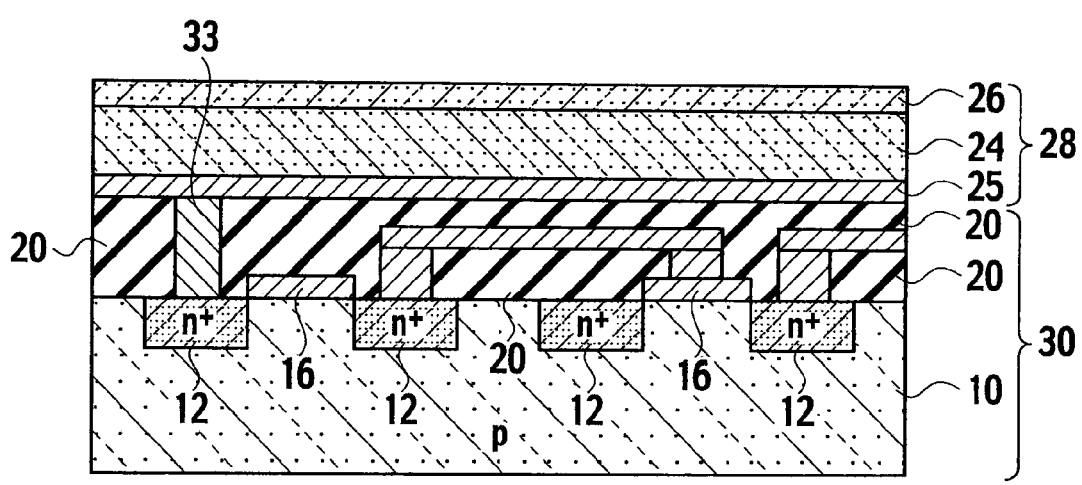
FIG. 14 is a schematic sectional view of structure at a pixel of a solid-state imaging device according to a modification of the second embodiment of the present invention.

FIG. 14 shows a section of a portion of one pixel of a solid-state imaging device according to a modification of the second embodiment that includes circuitry 30 as a portion formed on a semiconductor substrate 10, and a photoelectric converter 28 as a portion composed of a lower electrode layer 25 disposed on the circuitry 30, a set of compound-semiconductor thin films of chalcopyrite structure ($Cu(In_x,Ga_{1-x})Se_2$ ($0 \leq x \leq 1$)) 24 disposed on the lower electrode layer 25 and configured to work as a light absorbing layer, and a transparent electrode layer 26 disposed on the set of compound-semiconductor thin films 24.

The lower electrode layer 25, the set of compound-semiconductor thin films 24, and the transparent electrode layer 26 are stacked in order on the circuitry 30.

In the solid-state imaging device according to the modification of the second embodiment, the circuitry 30 includes transistors connected at source or drain regions 12 to the lower electrode layer 25.

For the lower electrode layer 25, there may be use of, for instance, molybdenum (Mo), niobium (Nb), tantalum (Ta), tungsten (W), etc.

The transparent electrode layer 26 is configured with a non-doped ZnO (i-ZnO) film having boundary surfaces to the set of compound-semiconductor thin films 24, and an $n^+$-type ZnO film disposed on the non-doped ZnO (i-ZnO) film.

According to this configuration, provision of the non-doped ZnO (i-ZnO) film as a transparent electrode layer 26 affords to plug occasional voids or pinholes in the set of CIGS thin films as a base thereof with a semi-insulating layer, while constituting i-p junctions with the set of CIGS films, allowing for a prevented leakage by tunnel currents due to direct contact of the conductive ZnO film ($n^+$) with CIGS films. Accordingly, the depth of non-doped ZnO (i-ZnO) film may well be increased to thereby reduce dark currents at p-n junction boundary surfaces.

As to the transparent electrode layer 26, other electrode materials may be applied. For instance, there may be use of an ITO film, a tin oxide ($SnO_2$) film, or an indium oxide ($In_2O_3$) film.

In configuration shown FIG. 14, the circuitry 30 may be made up by a CMOS integrated circuit, for instance, while detailed description is omitted. In FIG. 14, there are non-depicted gate insulation films 14 on regions of the semiconductor substrate 10 between source or drain regions 12. Further, between the lower electrode layer 25 and gate electrodes 16, three are VIA electrodes 33 built in an interlayer insulation film 20.

The solid-state imaging device according to the modification of the second embodiment has a set of photoelectric conversion cells configured with circuitry 30 and photoelectric converter 28, and integrated in a one-dimensional or two-dimensional matrix form.

For the set of pixels integrated in a one-dimensional or two-dimensional matrix form, the transparent electrode layer 26 is integrally formed in a planarizing manner over the area of semiconductor substrate surface, and electrically commonized.

That is, in the solid-state imaging device according to the modification of the second embodiment, the transparent electrode layer 26 serves as a cathode electrode for photodiodes (PD) constituting the photoelectric converter 28, and has a constant potential (e.g. power supply voltage). In this regard, in the set of pixels integrated in a one-dimensional or two-dimensional matrix form, the cathode electrode for photodiodes (PD) constituting the photoelectric converter 28 is not required to form in any segment separating manner, so it is integrally formed over the area of semiconductor substrate surface, and electrically commonized.

The solid-state imaging device according to the modification of the second embodiment has a stacked structure of circuitry 30 and photoelectric converter 28, thereby permitting the entirety of pixel regions of photoelectric conversion cells to be used as a substantial photoelectric conversion region. It has an aperture ratio within a range of approximately 80 to 90%.

The solid-state imaging device according to the modification of the second embodiment has no functions for amplification in comparison with the first embodiment, as a reflection of difference in circuit configuration.

The photoelectric converter 28 is similar in configuration to that of the solid-state imaging device according to the first embodiment, so solid-state imaging devices according to the second embodiment or the modification thereof conform to or comply with FIG. 5 showing a process of forming a set of compound-semiconductor thin films of chalcopyrite structure, FIG. 8 showing bandgap energies depending on composition ratios of compound-semiconductor thin films, FIG. 9 showing photoelectric conversion characteristics, FIG. 10 showing quantum efficiency vs. wavelength characteristics of compound-semiconductor thin films (CIGS thin films), FIG. 11 showing light absorption characteristics, and the like. As to FIG. 4 showing a fabrication method, those fabrication processes following a formation of circuitry are common. Accordingly, their description is omitted.

According to the second embodiment as well as the modification thereof, there is a solid-state imaging device including in a photoelectric converter 28 thereof a set of compound-semiconductor thin films of chalcopyrite structure 24 made of $Cu(In,Ga)Se_2$, thereby allowing for provision of a solid-state imaging device with high-sensitivities over a wide wavelength band ranging from visible wavelengths to near-infrared wavelengths, reduced dark currents, and a simplified structure.

According to the second embodiment as well as the modification thereof, there is a fabrication method for solid-state imaging devices permitting a transparent electrode layer 26 to be integrally formed in a planarizing manner on a substrate surface, without the need of patterning the transparent electrode layer 26, thus allowing for a simplified fabrication process.

According to the second embodiment as well as the modification thereof, there is a solid-state imaging device making use of a CIGS-based thin film having a proportion of indium (In) substituted in part by gallium, allowing for extension of band width to decrease carrier reassociation processes, reducing dark currents.

According to the second embodiment as well as the modification thereof, there is a solid-state imaging device as well as a fabrication method thereof affording to implement a planarized structure with an enhanced light receiving efficiency, allowing for an enhanced resolution.

According to the second embodiment as well as the modification thereof, there is a solid-state imaging device as well as a fabrication method thereof affording to omit an etching process to a compound-semiconductor thin film 24, thus allowing for a facilitated formation of miniature pattern.

According to the second embodiment as well as the modification thereof, there is a solid-state imaging device as well as a fabrication method thereof affording to omit etching damages to a set of compound-semiconductor thin films 24, thus allowing for an improved dark current characteristic.

According to the second embodiment as well as the modification thereof, there is a solid-state imaging device adapted to control bandgaps at $(Cu(In_x,Ga_{1-x})Se_2\ (0 \leq x \leq 1)$, affording to reduce the intensity of dark current by order of $10^2$.

Other Embodiments

While the present invention has been described by the first and second embodiments, it will be construed that no drawings or discussions constituting part of the disclosure should be restrictive to this invention. The disclosure may light artisan to various alternative embodiment modes, examples, or techniques for application.

According to the first embodiment or the second embodiment, there is a solid-state imaging device made sensitive even to near-infrared wavelengths and well available as an image sensor for, among others, security cameras (as cameras adapted to serve in daytime for sensing visible wavelengths and in nighttime for sensing near-infrared wavelengths), person identification cameras (as cameras adapted to serve for identification of persons by near-infrared wavelengths free of influences from external light), or vehicular cameras (as cameras vehicle-mounted to serve for nighttime vision aid or distant-sight security).

According to the first embodiment or the second embodiment, there is a solid-state imaging device employing $Cu(In_x, Ga_{1-x})Se_2$ ($0 \leq x \leq 1$) as a compound-semiconductor thin film of chalcopyrite structure, while it is not restrictive.

There are known CIGS thin films with a composition of $Cu(In_x,Ga_{1-x})(Se_y,S_{1-y})$ ($0 \leq x \leq 1$; $0 \leq y \leq 1$), as well, so CIGS thin films having such a composition may also be employed.

There are other compound-semiconductor thin films of chalcopyrite structure, such as $CuAlS_2$, $CuAlSe_2$, $CuAlTe_2$, $CuGaS_2$, $CuGaSe_2$, $CuGaTe_2$, $CuInS_2$, $CuInSe_2$, $CuInTe_2$, $AgAlS_2$, $AgAlSe_2$, $AgAlTe_2$, $AgGaS_2$, $AgGaSe_2$, $AgGaTe_2$, $AgInS_2$, $AgInSe_2$, and $AgInTe_2$, which also are each applicable.

According to the first embodiment or the second embodiment, there may be a solid-state imaging device having micro lens arranged on pixel regions, with a pixel-wise enhanced concentration of light.

Although embodiments described have a set of pixels, they are not restrictive, so there may be a PD (photodiode) configured simply with a single light-receiving region.

According to the first embodiment or the second embodiment, there is a solid-state imaging device including circuitry 30 configured with a CMOS integrated circuit as an example, while this configuration is not restrictive, so there may be use of any circuit configuration else. For instance, there may be a photoelectric converter 28 employing a set of compound-semiconductor thin films of chalcopyrite structure compliant with the first or the second embodiment of solid-state imaging device, while providing circuitry with a charge transfer function like a CCD (Charge Coupled Device).

According to the first embodiment or the second embodiment, there is a solid-state imaging device including a semiconductor substrate as a substantial substrate in description, while there may be use of a simplified configuration including a thin film formed on a glass substrate, and a system of prescribed circuits composed of thin film transistors formed in or on the thin film.

According to the first or the embodiment or modification thereof, there is a solid-state imaging device including a substrate of semiconductor as a substantial example in description, while this may not simply be a mono-crystalline substrate, but also an SOI (Silicon On Insulator) substrate aiming at lower power consumption and higher processing rates.

Such being the case, the present invention covers a variety of embodiment examples, beyond described ones.

INDUSTRIAL APPLICABILITY

According to the present invention there is a solid-state imaging device available as an image sensor for, among others, security cameras (as cameras adapted to serve in daytime for sensing visible wavelengths and in nighttime for sensing near-infrared wavelengths), person identification cameras (as cameras adapted to serve for identification of persons by near-infrared wavelengths free of influences from external light), or vehicular cameras (as cameras vehicle-mounted to serve for nighttime vision aid or distant-sight security), as well as an image sensor for detecting near-infrared wavelengths for medical purposes.

What is claimed is:

1. A solid-state imaging device comprising:
   circuitry formed on a substrate;
   a lower electrode layer disposed on the circuitry and configured as a set of segments separated from each other between column-wise or row-wise neighboring pixels;
   a set of compound-semiconductor thin films of chalcopyrite structure disposed on the lower electrode layer and configured as a set of segments separated from each other between column-wise or row-wise neighboring pixels; and
   a transparent electrode layer disposed on the set of compound-semiconductor thin films and planarized in structure between neighboring pixels,
   the lower electrode layer, the set of compound-semiconductor thin films, and the transparent electrode layer being stacked in order on the circuitry.

2. The solid-state imaging device according to claim 1, wherein said circuitry comprises a transistor connected at a gate thereof to the lower electrode layer.

3. The solid-state imaging device according to claim 1, wherein said circuitry comprises a transistor connected at a source or a drain thereof to the lower electrode layer.

4. The solid-state imaging device according to claim 1, wherein said circuitry, and the lower electrode layer, the set of compound-semiconductor thin films, and the transparent electrode layer being stacked in order on said circuitry are integrated together.

5. The solid-state imaging device according to claim 1, wherein said transparent electrode layer is integrally formed in a planarizing manner over a surface of the substrate.

6. The solid-state imaging device according to claim 1, wherein said set of compound-semiconductor thin films of chalcopyrite structure comprises $Cu(In_x, Ga_{1-x})Se_2$ ($0 \leq X \leq 1$).

7. The solid-state imaging device according to claim 1, wherein said transparent electrode layer comprises a non-doped ZnO film having boundary surfaces to the set of compound-semiconductor thin films, and an n-type ZnO film disposed on the non-doped ZnO film.

8. The solid-state imaging device according to claim 1, wherein said solid-state imaging device is configured as a photo sensor to be sensitive within a band covering near-infrared wavelengths.

9. The solid-state imaging device according to claim 1, wherein said solid-state imaging device is provided with a color filter on the transparent electrode layer.

* * * * *